United States Patent [19]
Anthony et al.

[11] 3,972,741
[45] Aug. 3, 1976

[54] MULTIPLE P-N JUNCTION FORMATION WITH AN ALLOY DROPLET

[75] Inventors: Thomas R. Anthony; Harvey E. Cline, both of Schenectady, N.Y.

[73] Assignee: General Electric Company, Schenectady, N.Y.

[22] Filed: Jan. 30, 1975

[21] Appl. No.: 545,530

Related U.S. Application Data

[62] Division of Ser. No. 464,801, April 29, 1974, abandoned.

[52] U.S. Cl. .............................. 148/1.5; 148/171; 148/172; 148/177; 148/179; 252/62.3 E; 252/62.3 GA; 357/13
[51] Int. Cl.² .......................................... H01L 7/34
[58] Field of Search ............ 148/1.5, 171, 172, 177, 148/179, 188, 190; 75/65 ZM; 357/13; 252/62.3 GA, 62.3 E

[56] References Cited
UNITED STATES PATENTS

| | | | |
|---|---|---|---|
| 2,701,326 | 2/1955 | Pfann et al. | 148/1.5 X |
| 2,813,048 | 11/1957 | Pfann | 148/1 |

*Primary Examiner*—G. Ozaki
*Attorney, Agent, or Firm*—Donald M. Winegar; Joseph T. Cohen; Jerome C. Squillaro

[57] ABSTRACT

A droplet of alloy material containing at least two semiconductor dopant type elements, each of which has a different ratio of diffusivity, is thermomigrated by a thermal gradient zone melting process through a body of semiconductor material leaving behind a recrystallized region of semiconductor material containing at least two dopant materials therein. Following thermomigration of the droplet, the body of semiconductor material is subjected to a post-thermomigration heat treatment at an appropriate temperature to allow the dopants in the region produced by thermomigration to diffuse substantially perpendicular to that region into the remaining material of the body. The slower diffusing dopant species is largely left behind in the region to form a region of conductivity type determined by the slower diffusing species while the faster diffusing species will diffuse outward and form an annulus around the recrystallized region of a conductivity type determined by the faster diffusing species. The original semiconductor material of the body will form a third conductivity type region.

With three dopants of different diffusivity in the alloy droplet it is possible to produce four regions of different type conductivity (including the original body of semiconductor material) with a single droplet thermomigration.

58 Claims, 13 Drawing Figures

MULTIPLE P-N JUNCTION FORMATION WITH AN ALLOY DROPLET

This is a division, of application Ser. No. 464,801, filed Apr. 29, 1974 now abandoned.

BACKGROUND OF THE INVENTION

1. Field of the Invention

This invention relates to multijunctions in a body of a semiconductor material and a temperature gradient zone melting process and diffusion heat treatment for making the same.

2. Description of Prior Art

W. G. Pfann describes in his book "Zone Melting" John Wiley & Sons, Inc. (1966), a thermal gradient zone melting process to produce P-N junctions within the bulk of a semiconductor material. In his method, either sheets or wires of a suitable metal-rich liquid are moved through a semiconductor material in a thermal gradient. Doped liquid epitaxial material is left behind the migrating liquid zone. For two decades, this process of temperature gradient zone melting has been practiced in an attempt to make a variety of semiconductor devices.

In our copending applications — "Method of Making Deep Diode Devices", U.S. Pat. No. 3,901,736; "Deep Diode Device Production and Method", Ser. No. 411,021; "Deep Diode Devices and Method and Apparatus", Ser. No. 411,001, now abandoned in favor of Ser. No. 552,154; "High Velocity Thermomigration Method of Making Deep Diodes", U.S. Pat. No. 3,898,106; "Deep Diode Device Having Dislocation-Free P-N Junctions and Method", U.S. Pat. No. 3,902,925; and "The Stabilized Droplet Method of Making Deep Diodes Having Uniform Electrical Properties", U.S. Pat. No. 3,898,361; and "Thermomigration of Metal-Rich Liquid Wires Through Semiconductor Materials, " Ser. No. 411,018, and now U.S. Pat. No. 3,898,362; assigned to the same assignee of this application, we teach the stability of droplets for thermomigration, and preferred planar orientations as well as critical dimensions of the droplets affecting the migration thereof.

In all of Pfann's work and the above copending applications, no more than one P-N junction in the case of a single droplet liquid zone or single sheet liquid zone temperature gradient zone melting process, and no more than two P-N junctions in the case of a single wire liquid zone temperature gradient zone melting process can be produced. In other words, in the prior art, no more than one type of conductivity and resistivity region can be introduced by a single temperature-gradient-zone-melting process.

However, for many types of semiconductor devices, more than two regions of different type conductivity or more than two regions of different levels of resistivity are required in a body of a semiconductor material. For example, a conventional silicon controlled rectifier or thyristor requires at least four regions of differing levels of resistivity and conductivity type for it to function as a device. In particular, a semiconductor controlled rectifier requires four contiguous regions of, respectively, $P^+$, N, P and $N^+$ type conductivity. Such devices can be made by the temperature gradient zone melting process by starting with an N-type semiconductor body and subjecting it to three separate and successive temperature gradient zone melting processes to produce the $P^+$, P and $N^+$ regions respectively in the body of N-type semiconductor material. Each separate temperature gradient zone melting process takes time, requires separate photolithography and etching steps, separate metal deposition steps and separate thermal gradient processing. Thus, it is clear that four or more sequential temperature gradient zone melting process would detrimentally decrease the final device yield of such a combined process.

Consequently, it is desirable to be able to introduce more than one region of a new level of resistivity and conductivity type in a body of semiconductor material with a single temperature gradient zone melting process utilizing a single liquid zone.

An object of this invention is to provide a new and improved process of introducing multiple regions of differing resistivity and conductivity type in a body of semiconductor material which overcomes the deficiencies of the prior art.

Another object of this invention is to provide a new and improved process of making multiple P-N junctions in a body of semiconductor material.

Another object of this invention is to provide a new and improved method of making thyristors.

A further object of this invention is to provide a new and improved semiconductor device embodying recrystallized regions of semiconductor material having solid solubility of a metal therein and regions of different and like type conductivity but different levels of resistivity formed by diffusion therein.

Other objects will, in part, be obvious and will, in part, appear hereinafter.

BRIEF DESCRIPTION OF THE INVENTION

In accordance with the teachings of this invention, there is provided a semiconductor device comprising a body of semiconductor material having a first selected type conductivity, a first selected level of resistivity and two major opposed surfaces which are respectively, the top and bottom surfaces of the body. A first region of substantially uniform width and resistivity and having a second selected type conductivity is formed in the body. The first region extends between and terminates in the top and bottom surfaces of the body. The material of the first region comprises recrystallized semiconductor material of the body having solid solubility of at least two semiconductor doping metals containing therein. The diffusivity of each metal in the material of the first region is different. The concentration of the metal of least diffusivity is the greatest therein. At least one second region of a third selected type conductivity is formed in the body and abuts the first region. The at least one second region extends between and terminates in the top and bottom surfaces of the body. The selected type of conductivity of the at least one second region is determined by the solid solubility semiconductor dopant metal of the first region having the next greatest diffusivity than the first semiconductor dopant metal. The resistivity of the at least one second region is substantially the same throughout any given plane of that region which is substantially perpendicular to the top and bottom surfaces of the body, and has a decreasing level of resistivity with an increase in distance from the first region in any plane which is substantially parallel to the top and bottom surfaces.

DESCRIPTION OF THE DRAWINGS

FIGS. 2, 3, 4, 5, and 6 are elevation views, in cross-section, of the body of semiconductor material of FIG. 1 processed in accordance with the teachings of this invention;

DESCRIPTION OF THE INVENTION

Figure 1:
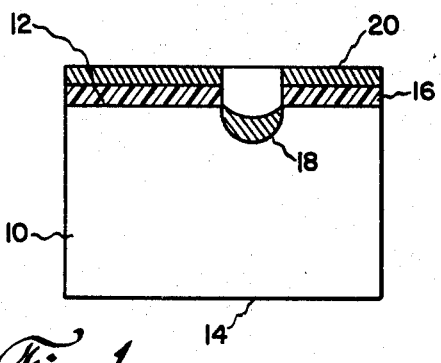
FIG. 1 is an elevation view in cross-section, of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a semiconductor compound of a Group II element and a Group VI element and a semiconductor compound of a Group III element and a Group V element. In order to describe the invention more fully, the body 10 is said to be of silicon semiconductor material having N-type conductivity.

The body 10 of silicon is mechanically polished, chemically etched to remove any damaged surfaces, rinsed in deionized water and dried in air. An acid resistant mask 16 is disposed on the surface 12 of the body 10.

Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask of a line or a droplet of predetermined width or diameter, respectively, is disposed on the layer of photoresist and exposed to ultraviolet light. After exposure, the layer of photoresist is washed in xylene to open a window in the mask where the line or the droplet is desired so as to be able to selectively etch the silicon oxide layer 16 exposed in the window.

Selective etching of the layer 16 of silicon oxide is accomplished with a buffered hydrofluoric acid solution ($NH_4F$-HF). The etching is continued until a second window corresponding to the window of the photoresist mask is opened in the layer 16 of silicon oxide to expose a selective portion of the surface 12 of the body 10 of silicon. The processed body 10 is rinsed in deionized water and dried. The remainder of the photoresist mask is removed by immersion in concentrated sulphuric acid at 180°C. or immersion in a mixture of 1 part by volume hydrogen peroxide and 1 part by volume concentrated sulphuric acid.

Selective etching of the exposed surface area of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20°C to 30°C, the mixed acid solution selectively etches the silicon of the body 10 at a rate of approximately 5 microns per minute. A depression 18 is etched in the surface 12 of the body 10 beneath each window of the oxide layer 16. The selective etching is continued until the depth of the depression 18 is approximately equal to the width of the window in the silicon oxide layer 16. However, it has been discovered, that the depression 18 should not be greater than approximately 100 microns in depth because undercutting of the silicon oxide layer 16 will occur. Undercutting of the layer 16 of silicon oxide has a detrimental effect on the width and registry of the metal "wire" or droplet to be migrated through the body 10. Etching for approximately 5 minutes at a temperature of 25°C will result in a depression 18 of from 25 to 30 microns in depth for a window width of from 10 to 500 microns. The etched body 10 is rinsed in distilled water and blown dry. Preferably, a gas such, for example, as freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material containing at least two elements which can impart respectively N and P-type conductivities to the semiconductor material of body 10 and which have different solid state diffusion coefficients in the semiconductor material of body 10. The thickness of layer 20 is approximately equal to the depth of depression 18. Therefore, when the depression 18 is 20 microns deep, the layer 20 is 20 microns deep. A suitable material for layer 20 is tin containing one atomic percent total of aluminum and antimony, with an aluminum/antimony atomic ratio of less than 3 and a suitable material for body 10 is N-type silicon with a carrier concentration of about $10^{15}$ carriers/cm$^3$ and a resistivity of 6 ohm-cm. Prior to migrating the metal wires or droplets in depressions 18 through the body of silicon 10, the excess metal of layer 20 is removed from the silicon oxide layer 16 by such suitable means as grinding away the excess metal with 600 grit carbide paper.

The preferred methods of depositing the metal 20 onto the silicon body 10 are by the electron beam method which includes a rotating multi-turret crucible and the like in order that all of the constituents of the metal layer are deposited sequentially without intervening exposure to oxygen wherein little, if any, oxygen can be trapped in the metal layer.

It has been discovered that the vapor deposition of the layer 20 of metal should be performed at a pressure of less than $5 \times 10^{-5}$ torr. When the pressure is greater than $5 \times 10^{-5}$ torr, we have found that in the case of metals deposited in depressions 18, the metal does not reliably penetrate into the silicon and migrate through the body 10. It is believed that the layer of metal is saturated with oxygen which prevents the reduction of a thin layer of silicon oxide formed when the silicon surface is exposed to air, by the metal, and thus prevents a good wetting of the contiguous surface of the silicon.

Figure 2:
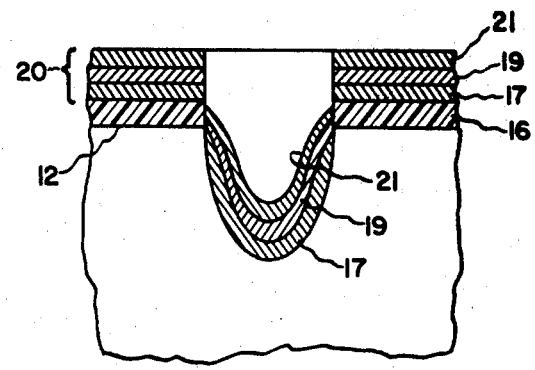
FIG. 2 is an enlarged view of a portion of the body of FIG. 1.

For example, when the metal wire or droplet comprises three elements such for example as tin, aluminum and antimony, the structure is as shown in FIG. 2. The metal layer 20 initially consists of three layers 17, 19 and 21 of the metal desired. For example, the layer 17 of tin is deposited to a thickness of approximately 100,000A by an electron beam method. The first source is covered, and a source of aluminum exposed and a layer 19 of aluminum approximately 1800A in thickness is deposited on the layer 17 of tin. The source of aluminum is covered and a source of antimony exposed and a layer 21 of antimony approximately 360A in thickness is deposited on the layer 19 of aluminum. Upon removal of the excess metal 20 to leave only the droplet 18 to be migrated, as shown with reference to FIG. 3, the metal alloy of the layer 20 is initially formed at the beginning of the process. The metal alloy in contact with the material of the body 10 begins the alloying process therewith and the migration of the droplet is then initiated.

Alternately, the layer 20 of metal alloy may be deposited by either one of two other methods. One of these methods is the codeposition of the different elements in the alloy simultaneously from a plurality of metal sources. Each metal source contains one of the elements. The other alternate method is to deposit the metal alloy layer 20 from a source of metal alloy comprising the desired elements of the alloy layer 20. In either of these cases care must be exercised as to temperature of operation, vapor pressure of metal elements involved and elapsed time of deposition.

The processed body 10 is placed in a migration apparatus, not shown, and the metal wire or droplet in the depression 18 is migrated through the body 10 by a thermal gradient zone melting process. A thermal gradient of approximately 50°C per centimeter between the bottom surface 14, which is the hot face, and the surface 12, which is the cold face, has been discovered to be appropriate for an average temperature of the body 10 from 700°C to 1350°C. The process is practiced for a sufficient lengthof time to migrate the metal wire or droplet through a body 10. For example, for a Sn-1% atomic percent total antimony and aluminum metal wire of 20 microns thickness, a thermal gradient of 1000°C for the 50°C/cm, a temperature of body 10, a furnace time of about 3 hours is required to migrate the wire through a silicon body 10 to 15 mils thickness.

When the material of the layer 20 which is formed in the depression 18 is of the shape of a metal droplet, the droplet migration should not be allowed to solidify within the body 10. Solidification of the droplet 20 within the body 10 may cause severe internal stresses and even fractures of the materials, which detrimentally affects the physical characteristics of the body 10. Complete failure of process body 10 is possible.

It has been discovered that when the body 10 is of silicon, germanium, silicon carbide, gallium arsenide semiconductor material and the like, the migrating metal droplet 20 has a preferred shape which also gives rise to region 22 being of the same cross-sectional shape as the migrating droplet 20. In a crystal axis direction of $<111>$ of thermal migration the droplet 20 migrates as a triangular platelet laying in a $(111)$ plane. The platelet is bounded on its edges by $(11\bar{2})$ planes. A droplet 20 larger than 0.10 centimeter on an edge is unstable and breaks up into several droplets during migration. A droplet 20 smaller than 0.0175 centimeter does not migrate into the body 10 because of a surface barrier problem.

The ratio of the droplet migration rate over the imposed thermal gradient is a function of the temperature at which the thermal migration of the droplet 20 is practiced. At high temperatures of the order of from 1050°C to 1400°C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In aluminum-silicon system, the droplet migration rate decreases by a factor of 2 when the droplet volume is decreased by a factor of 200.

A droplet 20 migrates in the $<100>$ crystal axis direction as a pyramid bounded by four forward $(111)$ planes and a rear $(100)$ plane. Careful control of the thermal gradient and migration rate is a necessity. Otherwise, the region 22 may be deposited with twists and kinks. It appears that there is a non-uniform dissolution of the four forward $(111)$ facets in that they do not always dissolve at a uniform rate. Non-uniform dissolution of the four forward $(111)$ facets may cause the regular pyramidal shape of the droplet to become distorted into a trapezoidal shape.

When the thermalgradient zone melting process is practiced to produce a planar region 22, the metal droplet 20 in the depression 18 is in the form of a metal wire. The depressions 18 are configured into troughlike depressions and the metal wire deposited therein. The preferred planar orientations for the surfaces 12 and 14, the preferred wire directions and the corresponding preferred directions of the thermal migration are as shown in the Table.

Table

| Wafer Plane | Migration Direction | Stable Wire Directions | Stable wire Sizes |
|---|---|---|---|
| (100) | $<100>$ | $<0\bar{1}1>$* | $<100$ microns |
|  |  | $<0\bar{1}\bar{1}>$* | $<100$ microns |
| (110) | $<110>$ | $<1\bar{1}0>$* | $<150$ microns |
| (111) | $<111>$ | †a) $<01\bar{1}>$ | $<500$ microns |
|  |  | $<10\bar{1}>$ |  |
|  |  | $<1\bar{1}0>$ |  |
|  |  | b) $<11\bar{2}>$* |  |
|  |  | $<\bar{2}11>$* | $<500$ microns |
|  |  | $<1\bar{2}1>$* |  |
|  |  | c) Any other* Direction in (111) plane* | $<500$ microns |

*The stability of the migrating wire is sensitive to the alignment of the thermal gradient with the $<100>$, $<110>$, and $<111>$ axis, respectively.
†Group a is more stable than group b which is more stable than group c.

It has also been discovered that the thermal migration of droplets and metal wires may be practiced in an inert gas atmosphere at a positive pressure wherein the body of semiconductor material is a thin wafer of the order of 10 mil thickness.

For a more thorough understanding of the temperature gradient zone melting process employed in this invention and for a more thorough description of the apparatus employed for the process, one is directed to our copending applications entitled "Method of Making Deep Diode Devices", U.S. Pat. No. 3,901,736;

"Deep Diode Device Production and Method", Ser. No. 411,021; "Deep Diode Devices and Method of Apparatus", Ser. No. 411,001, now abandoned in favor of Ser. No. 552,154; "High velocity Thermomigration Method of Making Deep Diodes", U.S. Pat. No. 3,898,106; "Deep Diode Device Having Dislocation-Free P-N Junctions and Method", U.S. Pat. No. 3,902,925; and "The Stabilized Droplet Method of Making Deep Diodes Having Uniform Electrical Properties," U.S. Pat. No. 3,899,361, and which are assigned to the same assignee of this invention.

Figure 3:
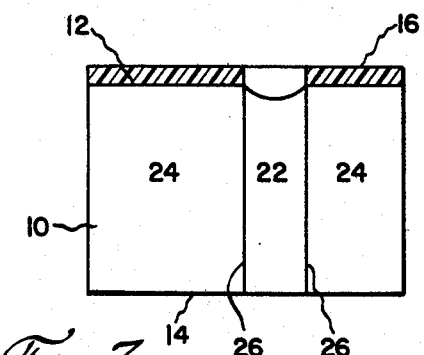

Upon completion of the temperature gradient zone melting process, the metal wire or droplet which has migrated through the body 10 onto the surface 14 is removed by selective etching or grinding. The resulting processed body 10 is as shown in FIG. 3. The thermal migration of the metal wire and droplet, respectively, in the depression 18 through the body 10 produces a body 10 with a planar or columnar region 22, respectively, of recrystallized semiconductor material of body 10 containing dissolved metals of which the droplet or wire was composed. The region 22 has a substantially constant uniform concentration level of the respective impurity metals throughout the entire planar or columnar region. Some variation in the concentration does occur because of the nature of the process practiced and the change in composition of materials is readily seen from the phase diagrams of the materials involved. However, the variation is ever so slight and inconsequential. The thickness in the case of a planar geometry and the diameter in the case of a columnr geometry of the region 22 is substantially constant for the entire region. The peripheral surface of the region 22 comprises in part the top surface 12 and the bottom surface 14 of the body 10. The remaining material of the body 10 is divided between the regions 24. The abutting surfaces of the regions 24 and 22 form a boundary 26 which may be a P-N junction if the regions 24 and 22 are of opposite type conductivity.

Figure 4:
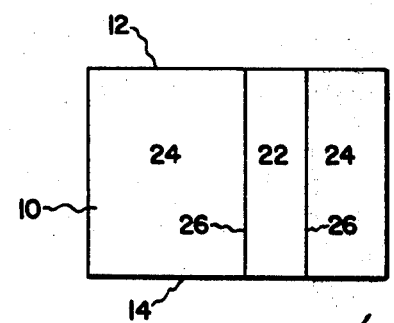
Figure 5:
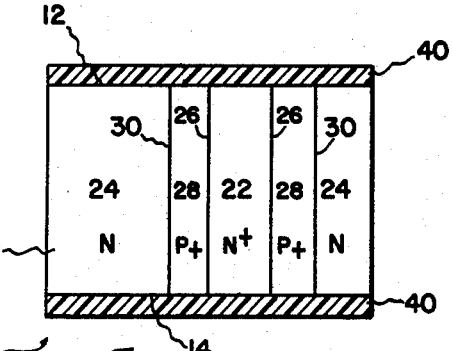

The semiconductor body 10, comprising regions 22 and 24, is further processed by removing the oxide layer 16 and the remaining depression 18 by mechanical grinding and polishing to produce the processed body 10 shown in FIG. 4, where the top surface 12 and the opposed bottom surface 14 are smooth, polished and planar. A new protective oxide layer 40 is grown or deposited on the opposed major surfaces 12 and 14 of body 10 as shown in FIG. 5. Either concurrently or in a separate heat treating process, the body 10 containing region 24 of first type conductivity and first type resistivity and region 22 containing the respective dopant impurities left behind in the recrystallized semiconductor material of region 22 by the metal-rich molten zone is subjected to a heat treatment. This heat treatment is a solid state diffusion process which must be at a suitably high temperature and must be carried out for a suitable length of time such that a significant amount of fast diffusing dopant impurity in region 22 can move by the process of solid state diffusion into region 24 and out of the region 22 defined by the peripheral side surfaces of boundaries 26 while the slow diffusing dopant impurity is largely retained in region 22. A significant amount of the fast diffusing dopant impurity is defined as the minimum amount required to convert a portion of region 24 of first type conductivity and a selected level of first resistivity contiguous to region 22 to a new region 28 of a second selected level of resistivity and a second type conductivity. Thus the concentration of the faster diffusing dopant species in the metal layer 20 of FIG. 1 must be high enough in order that enough fast diffusing impurity is available to determine the conductivity type of region 28.

Figure 6:
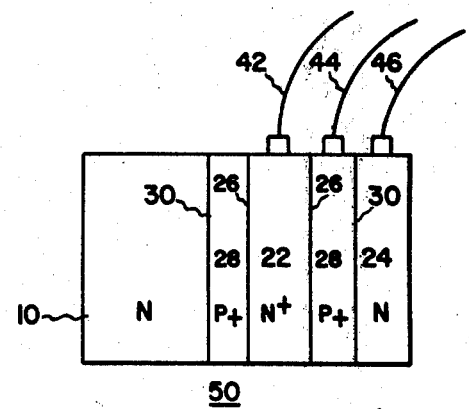

Referring now to FIG. 6, semiconductor device 50 in the form of a transistor is completed by affixing electrical leads 42, 44, 46 to respective regions 22, 28 and 24 and in an electrical conductive relationship therewith.

The device 50 has three regions 24, 28 and 22 of alternate type conductivity and different levels of resistivity. P-N junctions 26 and 30 are formed by the abutting surfaces of the respective pairs of regions 22 and 28 and 28 and 24 of opposite type conductivity. The slower diffusing dopant species implanted in the recrystallized semiconductor material of region 22 will be largely retained in region 22 to determinne the selected type of conductivity and second resistivity of region 22. The concentration of the slower diffusing dopant species in region 22 must be higher than the concentration of the faster diffusing dopant species in region 22 after the post-thermomigration diffusion heat treatment. For example, an aluminum/antimony atomic ratio of less than 3 to 1 in the original deposited metal layer 20 of FIG. 1 guarantees that the slower diffusing antimony dopant species will be at a higher concentration than the faster moving aluminum dopant species in region 22 and that the antimony will therefore determinne the conductivity type of region 22.

EXAMPLE I

Manufacture of An N-P$^+$-N$^+$-P$^+$-N Multijunction Arrangement with a Line Migration A body of N-type Sb doped silicon semiconductor material 15 mils thick having N-type conductivity and a resistivity of 6 ohm-centimeters was processed in accordance with the teachings of this invention to produce a structure as shown in FIG. 4. The line droplet in the depression 18 comprised tin containing one atomic percent total of aluminum and antimony in an aluminum to antimony atomic ratio of approximately 2 to 1. The total thickness of the layers deposited was 10 microns. The metal wire was migrated through the body 10 at a temperature of 1100°C ± 10°C. The vacuum was maintained at $2 \times 10^{-5}$ torr. The excess metal of the wire droplet was removed by mechanical polishing. A recrystallized region of semiconductor material containing aluminum, antimony and tin was formed in the body 10.

The processed body was placed in a diffusion furnace in a nitrogen atmosphere and heated to a temperature of approximately 1200°C ± 2°C and held at that temperature for ½ hour. The aluminum, having the highest rate of diffusion diffused laterally the farthest distance and established a P-type conductivity region of about 6 microns in thickness. Substantially, all of the antimony, having a slower rate of diffusion than the aluminum, remained in the recrystallized region and imparted thereto an N$^+$ type conductivity. The impurity concentration of antimony was greater than that of the aluminum remaining in the recrystallized region. The diffusion of tin was insignificant in that tin is substantially an intrinsic material. The resulting structure was of a N-P$^+$-N$^+$-P$^+$-N configuration, including the N-type conductivity material of the body.

Electrical tests were conducted using electrical probes. The results obtained indicated that P-N junctions were present in the device at the abutting surfaces of the respective pairs of regions of opposite type conductivity. Evaluation of the material employing a spreading resistance probe check showed the configuration to be N-P$^+$-N$^+$-P$^+$-N and a P-N junction present at the interface of each pair of regions of opposite type conductivity.

It has also been found that decreasing the amount of aluminum and antimony in the metal layer 20, but still maintaining the aluminum to antimony atomic ratio of 2, a simple N-P-N-P-N multijunction device can be fabricated by the process of this invention from a sngle line droplet migration.

Further, it has been discovered that a device embodying an N$^+$-P$^+$-N annular ring multijunction configuration is made by the migration of only a single droplet followed by the heat treatment to diffuse the element out from the recrystallized region formed by the migrated droplet.

EXAMPLE II

P-N-P$^+$-N$^+$-P$^+$-N-P Multijunction From A Single Line Droplet

Figure 7:
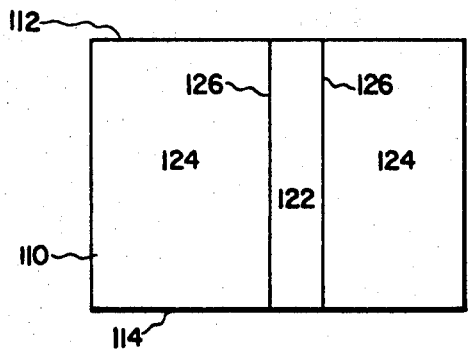
FIGS. 7 and 8 are elevation views in cross-section of a semiconductor device which is an alternate embodiment of this invention.

A body of P-type conductivity, boron doped semiconductor material having a resistivity of 10 ohm-centimeters was prepared as described heretofore with relation to the body 10 for the migration of a metal wire. The metal wire comprised an alloy of tin, aluminum, antimony and phosphorus. The aluminum, antimony and phosphorous were the elements of importance and had different solid state diffusivities in the semiconductor material of the body. The metal wire was deposited in the depression and comprised a plurality of layers of metals of a first layer of aluminum approximately 2500A thick disposed in contact with the semiconductor material, a second layer of phosphorus, approximately 100A thick disposed on the first layer, a third layer of antimony, approximately 500A thick, disposed on the second layer and a fourth layer of tin, approximately 136,000A in thickness, disposed on the third layer. The thicknesses of the layers were selected to provide a metal alloy wire composition of 99% tin-1% aluminum plus phosphorus plus antimony by atomic percent. The aluminum/antimony atomic ratio was less than 3 and the aluminum to phosphorus atomic ratio was greater than 30. The prepared body of material was placed in a furnace, in inert argon gas at 1 atmospheric pressure. The furnace was heated to a temperature of 1100°C ± 10°C and a thermal gradient of 50°C per centimeter, was established vertically in the body of semiconductor material. The metal-rich wire was formed by initially alloying together the metals of the four layers at the beginning of the migration cycle. The remainder of the heating cycle, the metal wire migrated through the body forming a recrystallized region having tin, phosphorus, aluminum and antimony impurities dssolved therein. The structure of the body is as shown in FIG. 7 wherein the body in 110, the top and bottom surfaces are 112 and 114 respectively, the recrystallized region is 122 and the P-type regions of the original body 10 are 124. A junction 126 is formed by the interface of the two regions 122 and 124.

The excess metal of the wire was removed by selective etching in white etch. The processed body 110 was then placed in a diffusion furnace and heated to a temperature of approximately 900°C ± 2°C and maintained thereat for 100 hours. At this furnace temperature the diffusivities D of phosphorus (P) aluminum (Al) and antimony (Sb) are in the order of $D_p > D_{Al} > D_{Sb}$. Therefore, with reference to FIGS. 8 and 9, the phosphorus diffused the farthest from the region 122 and formed the N-type regions 132. The aluminum diffused the next furthest and formed the P$^+$ region 128. Substantially, all the antimony remained in the region 122 and converted the region 122 to N$^+$ type conductivity.

Examination of the structure by employing the spreading resistance probe techniques established that the structure of the processed body was P-N-P$^+$-N$^+$-P$^+$-N-P. P-N junctions 126, 130 and 134 were formed at the interface of the respective abutting surfaces of 122 and 128, 128 and 132 and 132 and 124.

EXAMPLE III

N$^+$ - P$^+$ - N Annular Ring-Like Multijunction Device from a Single Droplet

Figure 10:
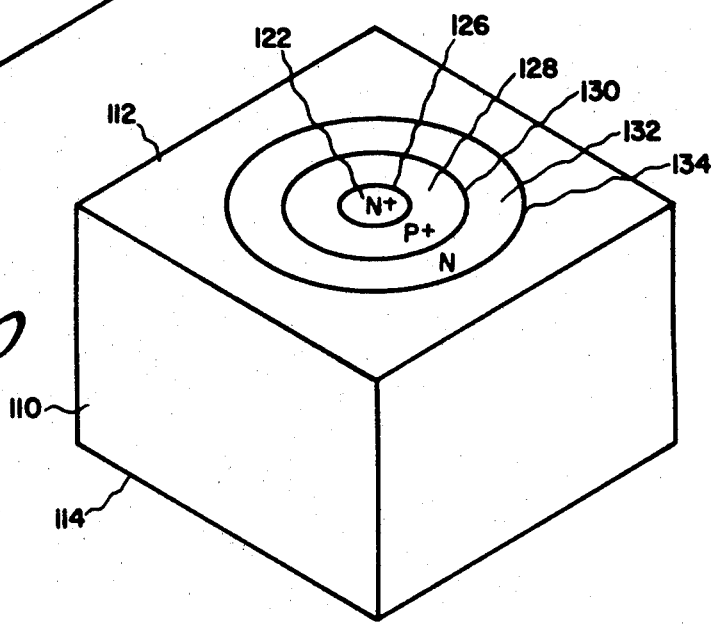
FIG. 10 is an isometric view of a transistor embodying an annular ring multijunction of this invention.

The process of Example II was repeated except that only a single metal alloy rich droplet was migrated through the P-type conductivity body. The structure of the processed body was as shown in FIG. 10. The same reference numbers indicate the same items as before, only the configuration of the structure of the region has changed.

Electrical tests were performed on the processed body. The results showed that region 132 was of N-type conductivity and a P-N junction 134 was formed by the interface of the abutting regions of opposite type conductivity. Region 128 was of P$^+$ type conductivity and a P-N junction 130 was formed by the interface of the regions 132 and 128 of opposite type conductivity. Region 122 was of N$^+$ type conductivity and a P-N junction 126 was formed at the interface of regions 128 and 122 of opposite type conductivity.

Figure 11:
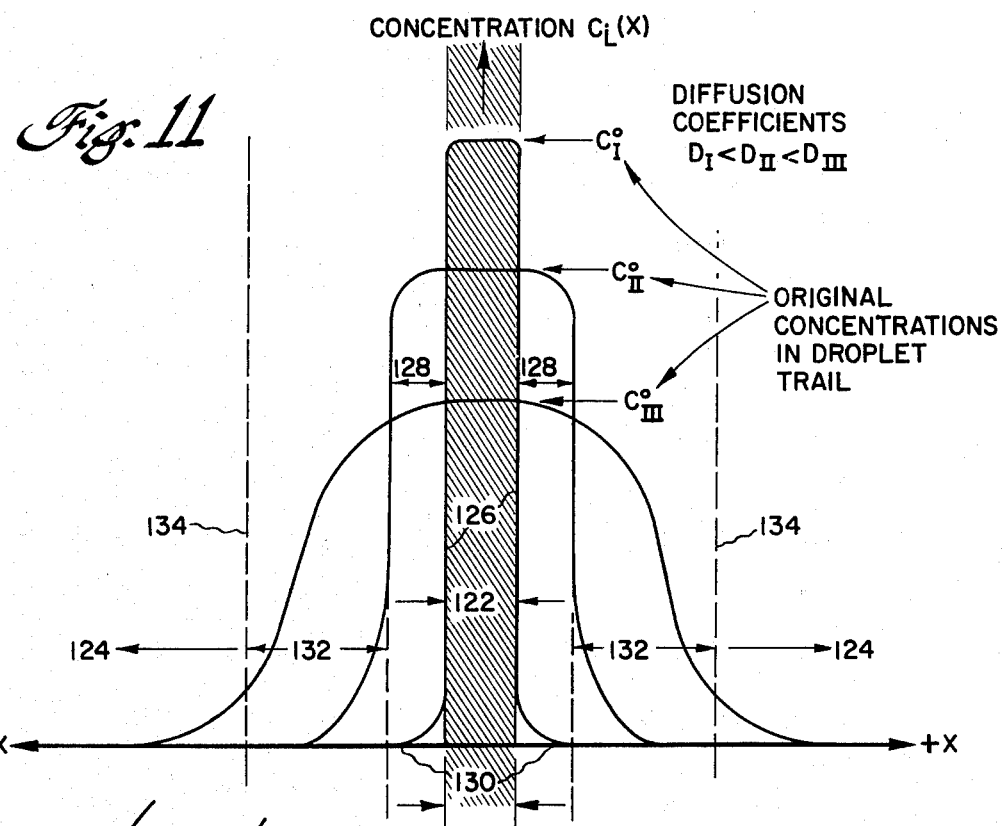
FIG. 11 is a cross-section of the concentration profiles of dopant impurities in a multijunction device of the type shown in FIG. 9.

In general, the appropriate dopants for the various layers of the multijunction are chosen on the basis of their conductivity type (P or N type) and their diffusivity. The fastest diffusing dopant of a particular alloy droplet will produce the doped region farthest from the original droplet trail. The next fastest diffusing dopant will form the next inner layer, etc. Finally, the slowest diffusing dopant will determine the conductivity type of the original droplet trail. This overall situation is depicted in FIG. 11, where the concentration profiles of the dopant impurities, I, II and III, respectively, are shown for the cross-section 8-8 of FIG. 9. It can be summarized by $D_I < D_{II} < D_{III}$ where $D_I$ is the diffusion coefficient of the innermost layer dopant, $D_{II}$ is the diffusion coefficient of the middle layer dopant and $D_{III}$ is the diffusion coefficient of the outermost layer dopant.

In general, the dopant concentration $C_i(x,t)$ in region 24 after the post-migration heat treatment of duration I is given by equation $$C_i(x,t) = C_i^\circ \text{erfc} \frac{x}{2\sqrt{D_i t}} \qquad (1)$$

where $x$ is the distance from the original droplet trail of region 22 of recrystallized semiconductor material, $C_i^\circ$ is the concentration of the ith dopant impurity in the region 22 of recrystallized semiconductor material and $D_i$ is the diffusion coefficient of the ith dopant impurity in the semiconductor material of body 10. $C_i^\circ$ is given by $$C_i^o = X_i^p C_i^s \tag{2}$$

where $X_i^p$ is the atomic fraction of the ith impurity dopant in the liquid metal-rich droplet and $C_i^s$ is the equilibrium solid solubility of the ith dopant impurity in the semiconductor material of body 10 at the temperature gradient zone melting processing temperature. From equations 1 and the fact that $D_I < D_{II} < D_{III}$, it is clear from FIG. 11 that $C_I^o > C_{II}^o > C_{III}^o$ if the respective regions 22, 28 and 32 are to have the desired type of conductivity and resistivity. By use of the solid solubilities of impurity dopants in the semiconductor material of body 10 and the solid state diffusion coefficients of the impurity dopants in the semiconductor material of body 10, the appropriate doping impurity atomic fractions $X_i^p$ that are to be in the original metal-rich liquid droplet or wire can be determined from equation 2 and the condition that $C_I^o > C_{II}^o > C_{III}^o$.

Figure 8:
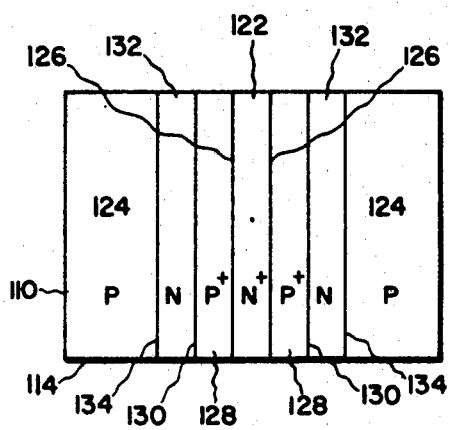
Figure 9:
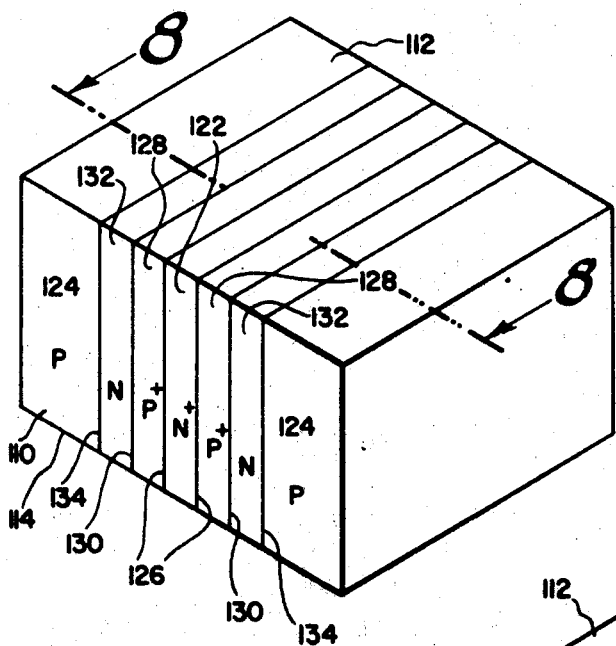
FIG. 9 is an isometric view of the semiconductor device of FIGS. 7 and 8.
Figure 12:
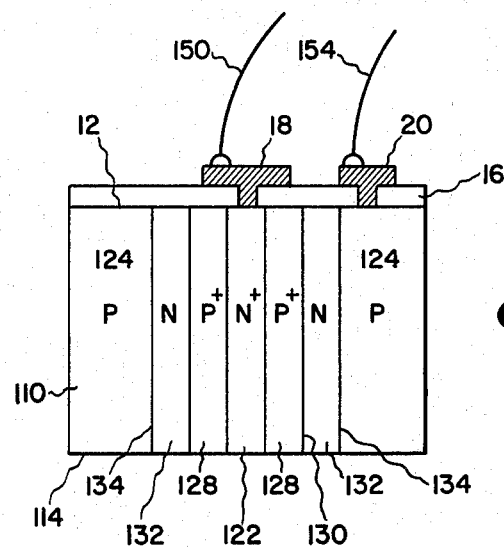
FIG. 12 is an elevation view in cross-section of a thyristor made in accordance with the teachings of this invention.

Referring now to FIG. 12, there is shown an N⁺-P-N-P semiconductor switch embodying the processed body 10 and its lamellar structure of FIG. 8. Those items denoted by the same reference numbers as those of processed body 10 are the same and function in the same manner of those of FIGS. 6 and 8. An oxide layer, such, for example as silicon oxide, 16 is deposited on the surface 12 of the body 10 with windows over region 22 and over one region 24. Employing suitable photolithographic techniques and metal deposition means known to those skilled in the art, metal layers 18 and 20 are affixed to the respective regions 22 and 24 of the device. Electrical leads 52 and 54 are affixed to metal contact layers 18 and 20, respectively, to produce a four region, three junction semiconductor switch.

Figure 13:
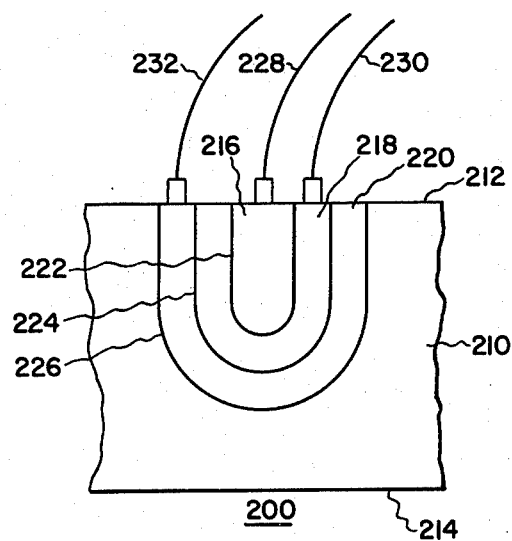
FIG. 13 is an elevation view in cross-section of a transistor made in accordance with the teachings of this invention.

Referring now to FIG. 13, there is shown a transistor 200 which is an alternate embodiment of the transistors 50 and the device of FIG. 10 and made in accordance with the teachings of this invention. The transistor comprises a body 210 of semiconductor material having a first type conductivity, a selected resistivity and two opposed major surfaces 212 and 214 which are, respectively, the top and bottom surfaces of the body 210. Three abutting regions 216, 218 and 220 of alternate and opposite type conductivity, each having a selected level of resistivity, are formed in the body 210. P-N junctions 222 and 224 are formed by the interfaces of the respective pairs of regions 216 and 218 and 218 and 220 of opposite type conductivity. The interface 222 formed by the abutting surfaces is a P-N junction wherein, preferably, the region 220 and the body 210 are of opposite type conductivity.

The region 216 is formed by temperature gradient zone melting in the same manner as described with reference to FIGS. 1 through 5 except that the droplet is migrated to only a selected depth from the surface from whence migration is initiated. The migration process is stopped, the thermal gradient reversed and the droplet is migrated along the same axis to the original starting surface 212 and the excess removed, preferably, a new layer of silicon oxide, not shown. The result is a region 216 of recrystallized material 210 having, initially solid solubility of two or more dopant impurities therein. For a better understanding of the thermal gradient zone melting process practiced, one is directed to our copending application entitled "Deep Finger Diodes", Ser. No. 411,002, and now abandoned in favor of Ser. No. 559,262, assigned to the same assignee of this same invention and is incorporated herein by reference.

A new layer of silicon oxide, not shown, or other suitable material is deposited on the surfaces of the body 210 to prevent out-diffusion of the dopant impurities in the material of the region 216 during post thermal gradient zone melting heat treat operation. In a similar manner as before, the processed body 210 is heated to a suitable elevated temperature where it is maintained for a sufficient time to cause the dopant impurities to diffuse outwardly from the region 216 in accordance with the invention as described heretofore. Electrical leads 228, 230 and 232 are affixed to the respective regions 216, 218 and 220 to provide the functional transistor 200 of FIG. 13.

In the final structure, the region 216 comprises recrystallized material of the body 210 having solid solubility of dopant impurities therein. The dopant material of least diffusivity is the dominant dopant material therein and establishes the type conductivity and level of resistivity for region 216. The impurities concentration is substantially constant throughout region 216 and the region 216 is substantially uniform in width throughout.

The regions 218 and 220 are formed by diffusion and their conductivity type and level of resistivity is derived from the respective impurities of increasing higher diffusivity. The level of resistivity of the region 218 increases with increasing distance from the region 216. When the regions 216 and 218 are of opposite type conductivity, the P-N junction 222 is formed by the abutting surfaces thereof. The level of resistivity of the region 220 increases with increasing distance from the region 218. P-N junctions 224 and 226 are each formed if the respective abutting regions and/or body of material are of opposite type conductivity.

We claim as our invention:

1. A process for making a semiconductor device comprising the process steps of:
   a. selecting a body of semiconductor material having a predetermined level of resistivity, a predetermined type conductivity and two major opposed surfaces which are, respectively, the top and bottom surfaces thereof, at least one of the major surfaces having a preferred planar crystal structure orientation and a vertical axis which is substantially parallel with a first axis of the crystal structure and substantially perpendicular to the at least one major surface having the preferred crystal planar orientation;
   b. depositing a predetermined thickness of a layer of material of a predetermined composition having at least two different dopant impurities therein, suitable for doping a predetermined semiconductor material, on a predetermined portion of the at least one major surface of the body having the preferred crystal planar orientation, the layer of material having a predetermined geometrical configuration, and each dopant impurity material having a different rate of diffusivity in the semiconductor material;
   c. heating the body and the material deposited thereon to an elevated temperature sufficient to form a melt of each layer of deposited material and portion of the semiconductor material in contact therewith;
   d. establishing a temperature gradient across the body between the two opposed major surfaces, wherein the surface upon which the melt is formed is at the lower temperature;

e. migrating each melt through the entire body from the surface of lower temperature to the surface of higher temperature to form a region of recrystallized semiconductor material of the body having solid solubility of the deposited material therein, and f. heating the processed body to an elevated temperature for an elapsed period of time sufficient to allow a portion of the dopant impurity materials to diffuse outward from the region of recrystallized material into the mutually adjacent semiconductor material of the body to form a second region of diffused semiconductor material of the body having a second predetermined type conductivity and a predetermined level of resistivity, and the type conductivity and level of resistivity being determined by the dopant impurity material having the highest diffusivity, the level of concentration of the dopant impurity material in the second region being substantially the same throughout any given plane which is substantially parallel to the abutting surfaces of the first and second regions and the level of resistivity in the second region increasing with increasing distance from the interface of the first and second region in any plane which is substantially perpendicular thereto.

2. The process of claim 1 including practicing the process step prior to the depositing of the layer of material of selectively etching the predetermined portion of the major surface of the body to form a depression therein of a predetermined geometrical configuration into which the material is deposited.

3. The process of claim 2 wherein
the layer of material is vapor deposited.

4. The process of claim 3 wherein
the vapor deposited material is substantially free of oxygen.

5. The process of claim 2 wherein
the preferred planar crystal orientation is (111), and the first crystal axis is <111>.

6. The process of claim 5 wherein
the material of the body is one selected from the group consisting of silicon, silicon carbide, germanium and gallium arsenide.

7. The process of claim 6 wherein
the material of the body is antimony doped silicon of N-type conductivity, and
the layer of material comprises tin, aluminum and antimony.

8. The process of claim 6 wherein
the material of the body is boron doped silicon of P-type conductivity, and
the layer of material comprises tin, aluminum, antimony and phosphorus.

9. The process of claim 5 wherein
each layer of material has a preferred wire-like geometrical configuration oriented in a preferred crystal wire direction which is at least one selected from the group consisting of <01$\bar{1}$>, <10$\bar{1}$>, <1$\bar{1}$0>, <11$\bar{2}$>, <$\bar{2}$11> and <1$\bar{2}$1>.

10. The process of claim 9 wherein
the material of the body is one selected from the group consisting of silicon, silicon carbide, germanium and gallium arsenide.

11. The process of claim 10 wherein
the material of the body is antimony doped silicon of N-type conductivity, and
the layer of material comprises tin, aluminum and antimony.

12. The process of claim 10 wherein
the material of the body is boron doped silicon of P-type conductivity, and
the layer of material comprises tin, aluminum, antimony and phosphorus.

13. The process of claim 9 wherein
the width of the migrating melt is less than 500 microns.

14. The process of claim 2 wherein
the preferred planar crystal orientation is (100), and the first crystal axis is <100>.

15. The process of claim 14 wherein
the material of the body is one selected from the group consisting of silicon, silicon carbide, germanium and gallium arsenide.

16. The process of claim 15 wherein
the material of the body is antimony doped silicon of N-type conductivity, and
the layer of material comprises tin, aluminum and antimony.

17. The process of claim 15 wherein
the material of the body is boron doped silicon of P-type conductivity, and
the layer of material comprises tin, aluminum, antimony and phosphorus.

18. The process of claim 14 wherein
each deposited layer has a preferred wire-like configuration oriented in a preferred crystal wire direction which is at least one selected from the group consisting of <011> and <0$\bar{1}$1>.

19. The process of claim 18 wherein
the material of the body is one selected from the group consisting of silicon, silicon carbide, germanium and gallium arsenide.

20. The process of claim 19 wherein
the material of the body is antimony doped silicon of N-type conductivity, and
the layer of material comprises tin, aluminum and antimony.

21. The process of claim 19 wherein
the material of the body is boron doped silicon of P-type conductivity, and
the layer of material comprises tin, aluminum, antimony and phosphorus.

22. The process of claim 18 wherein
the width of the migrating melt is less than 100 microns.

23. The process of claim 2 wherein
the preferred planar crystal orientation is (110);
each layer of material has a preferred wire-like geometrical configuration oriented in a preferred crystal wire direction of <1$\bar{1}$0>, and
the first crystal axis is <110>.

24. The process of claim 23 wherein
the material of the body is one selected from the group consisting of silicon, silicon carbide, germanium and gallium arsenide.

25. The process of claim 24 wherein
the material of the body is boron doped silicon of P-type conductivity, and
the layer of material comprises tin, aluminum, antimony and phosphorus.

26. The process of claim 23 wherein
the material of the body is antimony doped silicon of N-type conductivity, and the layer of material comprises tin, aluminum and antimony.

27. The process of claim 23 wherein the width of the migrating melt is less than 150 microns.

28. The process of claim 2 wherein the preferred planar orientation is (110), and the first crystal axis is < 110 >.

29. The process of claim 28 wherein the material of the body is one selected from the group consisting of silicon, silicon carbide, germanium and gallium arsenide.

30. The process of claim 28 wherein the material of the body is antimony doped silicon of N-type conductivity, and
the layer of material comprises tin, aluminum and antimony.

31. The process of claim 29 wherein the material of the body is boron doped silicon of P-type conductivity, and
the layer of material comprises tin, aluminum, antimony and phosphorus.

32. The process of claim 1 wherein migrating each melt is practiced for a period of time sufficient to migrate the melt a predetermined distance into the body less than the thickness of the body and then stopping the migration of the melt, establishing a new thermal gradient substantially parallel with the first crystal axis wherein the major surface on which the melt was formed initially is now at the higher temperature and migrating each melt substantially through the first region of recrystallized material of the body to the same major surface to form a second region comprising substantially the recrystallized material of the first region having solid solubility of the material of the deposited layer therein.

33. The process of claim 32 including practicing the process step prior to the depositing of the layer of material of
selectively etching the predetermined portion of the major surface of the body to form a depression therein of a predetermined geometrical configuration into which the material is deposited.

34. The process of claim 33 wherein the layer of material is vapor deposited.

35. The process of claim 33 wherein the preferred planar crystal orientation is (111), and the first crystal axis is < 111 >.

36. The process of claim 35 wherein the material of the body is one selected from the group consisting of silicon, silicon carbide, germanium and gallium arsenide.

37. The process of claim 36 wherein the material of the body is antimony doped silicon of N-type conductivity, and
the layer of material comprises tin, aluminum and antimony.

38. The process of claim 36 wherein the material of the body is boron doped silicon of P-type conductivity, and
the layer of material comprises tin, aluminum, antimony and phosphorus.

39. The process of claim 35 wherein each layer of material has a preferred wire-like geometrical configuration oriented in a preferred crystal wire direction which is at least one selected from the group consisting of < $01\bar{1}$ >, < $10\bar{1}$ >, < $1\bar{1}0$ >, < $11\bar{2}$ >, < $\bar{2}11$ > and < $1\bar{2}1$ >.

40. The process of claim 39 wherein the material of the body is one selected from the group consisting of silicon, silicon carbide, germanium and gallium arsenide.

41. The process of claim 40 wherein the material of the body is antimony doped silicon of N-type conductivity, and
the layer of material comprises tin, aluminum and antimony.

42. The process of claim 40 wherein the material of the body is boron doped silicon of P-type conductivity, and
the layer of material comprises tin, aluminum, antimony and phosphorus.

43. The process of claim 39 wherein the width of the migrating melt is less than 500 microns.

44. The process of claim 33 wherein the preferred planar crystal orientation is (100), and the first crystal axis is < 100 >.

45. The process of claim 44 wherein the material of the body is one selected from the group consisting of silicon, silicon carbide, germanium and gallium arsenide.

46. The process of claim 45 wherein the material of the body is antimony doped silicon of N-type conductivity, and
the layer of material comprises tin, aluminum and antimony.

47. The process of claim 45 wherein the material of the body is boron doped silicon of P-type conductivity, and
the layer of material comprises tin, aluminum, antimony and phosphorus.

48. The process of claim 33 wherein each deposited layer has a preferred wire-like configuration oriented in a preferred crystal wire direction which is at least one selected from the group consisting of < 011 > and < $0\bar{1}1$ >.

49. The process of claim 48 wherein the material of the body is one selected from the group consisting of silicon, silicon carbide, germanium and gallium arsenide.

50. The process of claim 49 wherein the material of the body is antimony doped silicon of N-type conductivity, and
the layer of material comprises tin, aluminum and antimony.

51. The process of claim 49 wherein the material of the body is boron doped silicon of P-type conductivity, and
the layer of material comprises tin, aluminum, antimony and phosphorus.

52. The process of claim 48 wherein the width of the migrating melt is less than 100 microns.

53. The process of claim 33 wherein the preferred planar crystal orientation is (110);
each layer of material has a preferred wire-like geometrical configuration oriented in a preferred crystal wire direction of < $1\bar{1}0$ >, and
the first crystal axis is < 110 >.

54. The process of claim 53 wherein the material of the body is one selected from the group consisting of silicon, silicon carbide, germanium and gallium arsenide.

55. The process of claim 54 wherein
the material of the body is boron doped silicon of P-type conductivity, and
the layer of material comprises tin, aluminum, antimony and phosphorus.

56. The process of claim 53 wherein
the material of the body is antimony doped silicon of N-type conductivity, and
the layer of material comprises tin, aluminum and antimony.

57. The process of claim 53 wherein
the width of the migrating melt is less than 150 microns.

58. The process of claim 35 wherein
the vapor deposited material is substantially free of oxygen.

* * * * *